US 6,716,756 B2

(12) United States Patent
Kang

(10) Patent No.: US 6,716,756 B2
(45) Date of Patent: Apr. 6, 2004

(54) METHOD FOR FORMING CAPACITOR OF SEMICONDUCTOR DEVICE

(75) Inventor: Tae Woong Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 97 days.

(21) Appl. No.: 09/942,784

(22) Filed: Aug. 31, 2001

(65) Prior Publication Data

US 2002/0127854 A1 Sep. 12, 2002

(30) Foreign Application Priority Data

Aug. 31, 2000 (KR) ........................................ 2000-51214

(51) Int. Cl.[7] ............................................. H01L 21/301
(52) U.S. Cl. ....................................... 438/692; 438/694
(58) Field of Search ........................ 438/239, 253–257, 438/396–399, 692, 694, 700

(56) References Cited

U.S. PATENT DOCUMENTS

| 5,994,197 | A | * | 11/1999 | Liao ........................... 438/396 |
| 5,998,260 | A | * | 12/1999 | Lin ............................ 438/254 |
| 6,130,449 | A | * | 10/2000 | Matsuoka et al. .......... 257/296 |
| 6,465,351 | B1 | * | 10/2002 | Jeong ......................... 438/689 |
| 6,479,343 | B1 | * | 11/2002 | Hwang et al. .............. 438/253 |
| 6,492,223 | B2 | * | 12/2002 | Kanamori et al. .......... 438/240 |

* cited by examiner

*Primary Examiner*—Kin-Chan Chen
(74) *Attorney, Agent, or Firm*—Birch, Stewart, Kolasch & Birch, LLP

(57) ABSTRACT

The method for forming a capacitor of a semiconductor device includes the steps of forming a first insulation layer on the upper surface of a semiconductor substrate, forming a second insulation layer on the upper surface of the first insulation layer, and forming a third insulation layer on the upper surface of the second insulation layer. The third insulation layer and the second insulation layer are sequentially etched to form at least one hole over a cell region of the semiconductor substrate. Next a conductive layer is formed over the semiconductor substrate, and Chemical Mechanical Polishing (CMP) is performed until an upper surface of the third insulation layer is exposed. Then, portions of the third insulation layer and slurry material from the CMP are removed from the cell region.

18 Claims, 5 Drawing Sheets

METHOD FOR FORMING CAPACITOR OF SEMICONDUCTOR DEVICE

BACKGROUND OF THE INVENTION

1. Field of the Invention

The present invention relates to a method for fabricating a semiconductor device, and more particularly to a method for forming a capacitor of a semiconductor device.

2. Description of the Background Art

In various technical fields using integrated circuits, a DRAM (Dynamic Random Access Memory) is widely used for a memory device, and recently, the DRAM is rapidly becoming more highly integrated.

Most DRAM devices are fabricated by using a silicon substrate, and each cell of the DRAM includes a single MOSFET (Metal Oxide Semiconductor Field Effect Transistor). A source of the MOSFET in each cell is connected with a single storage capacitor.

In order to improve the integration of the DRAM cell, each cell area is reduced in size; consequently, storage capacitance is reduced. Reduction of the storage capacitance leads to a reduction of a source/drain ratio and degradation of reliability due to an undesirable signal problem.

Therefore, in order to improve integration without degrading reliability, a capacitor having a sufficient capacitance has to be formed in the reduced cell.

As one approach to improve the capacitance in the DRAM cell, a stacked cylindrical capacitor is used. The cylindrical capacitor has a capacitor structure such that a space on a device is utilized as a capacitor plate to thereby improve capacitance.

The stacked cylindrical capacitor is formed in a manner that, after a hole for forming a lower electrode is formed, polysilicon is deposited to form the lower electrode. Then, the polycrystalline silicon is separated from each lower electrode by etching back or by Chemical Mechanical Polishing (CMP), to form each capacitor. In this respect, the etch back technique is mostly used to prevent a deficiency due to a slurry foreign material produced during the CMP process.

FIGS. 1A through 1G show the processes steps of a method for forming a capacitor in accordance with a conventional art.

First, as shown in FIG. 1A, there is prepared a semiconductor substrate 1 having a MOSFET (not shown). The semiconductor substrate 1 is divided into a cell region (A) and a periphery region (B).

A first insulation layer 3, typically made of silicon oxide, is formed on the upper surface of the semiconductor substrate 1. A hole 5 is formed at a portion corresponding to the cell region (A) of the first insulation layer 3 by the well known photo-etching technique, and a plug 7 is formed in the hole 5.

Subsequently, a second insulation layer 9, made of silicon nitride, is formed on the upper surface the first insulation layer 3 and of the plug 7. And a third insulation layer 11, typically made of silicon oxide, is formed on the upper surface of the second insulation layer 9.

Next, as shown in FIG. 1B, photoresist film is coated on the upper surface of the third insulation layer 11 and patterned to form a photoresist film pattern 13.

And then, predetermined portions of the third insulation layer 11 and of the second insulation layer 9 are etched by an etching process using the photoresist film pattern 13 as a mask to form a hole 15 exposing the plug 7.

At the same time, the regions corresponding to the margin portions of the cell region (A) and of the periphery region (B), forming a line 17 are etched. The line 17 forms a boundary defining the cell region (A) and the periphery region (B) of the semiconductor device.

And, as shown in FIG. 1C, the photoresist film pattern 13 is removed, and a polycrystalline silicon layer 19 is deposited on the upper surface of the third insulation layer 11 and in the hole 15 and in the line 17. The polycrystalline silicon layer will later form a lower electrode.

Then, as shown in FIG. 1D, an oxide film 21, such as an SOG (Spin On Glass) or a USG (Undoped Silica Glass) that has a favorable gap fill characteristic, is deposited on the upper surface of the polycrystalline silicon layer 19 and is etched back to expose the polycrystalline silicon layer 19 formed on the surface of the third insulation layer 11.

Next, as shown in FIG. 1E, the polycrystalline silicon layer 19 positioned on the surface of the third insulation layer 11 is etched to separate the polycrystalline silicon layer 19, forming lower electrode 23. The lower electrode 23 is connected with the plug 7.

And then, as shown in FIG. 1F, a photoresist film pattern 25 is formed on the third insulation layer 11 corresponding to the periphery region (B). The photoresist film pattern 25 serves to prevent the portion corresponding to the periphery region of the third insulation layer 11 from being etched during a follow-up etching process.

Lastly, as shown in FIG. 1G, the portion corresponding to the cell region (A) of the third insulation layer 11 is etched and the photoresist film pattern 25 is removed, thereby completing formation of a capacitor lower electrode.

However, the method for forming the capacitor by etching back in accordance with the conventional art has the following problems.

As the cell becomes small in size, in order to obtain a large capacitance, the lower electrode should be high, for which, thus, the photoresist film 13 has to be sufficiently high for etching the hole 15 for the lower electrode. However, because the cell is reduced in size, the photoresist film is lower in height to obtain the desired pattern by the well known photo-etching technique.

Thus, in order to avoid this problem, before performing the photo-etching, a polycrystalline silicon (not shown) is additionally deposited as a hard mask and then etched.

However, in this case, since the polycrystalline silicon to be etched by the etch back process to separate the lower electrode is increased in thickness, after the polycrystalline silicon is etched back, the upper portion of the lower electrode 23 becomes sharp.

When the upper portion of the lower electrode becomes sharp, electric field collects at the sharp portion, resulting in a high possibility that leakage current occurs.

And, in case that a positive (+) voltage is applied to an upper electrode, since the dopant at the sharp portion is distanced from the dielectric film, a depletion phenomenon occurs, causing a reduced capacitance.

In addition, since a number of holes are formed at the cell region (A), a loading effect occurs that the etching rate of the hard-masking polycrystalline silicon (not shown) existing at the periphery region (B) is lower than that of the polycrystalline silicon of the cell region during etching.

Thus, if over-etching is performed to completely remove the polycrystalline silicon at the periphery region, the height of the lower electrode is lowered, leading to a reduction in capacitance.

Moreover, in order to prevent the polycrystalline silicon in the hole from being etched during the process of separating the lower electrode, the hole has to be filled with the oxide film 21, such as the SOG or the USG having a good gap fill characteristic, and then the oxide is to be removed. This makes the processes complicated.

Furthermore, in order to prevent the increase of the step coverage between the cell region (A) and the periphery region (B), which is caused as the periphery region (B) of the third insulation layer 11 is etched, the photoresist film pattern 25 has to be formed on the surface of the third insulation layer 11 corresponding to the periphery region (B). This also makes the processes complicated.

In addition, the photoresist film pattern 25 has to be formed on the third insulation layer corresponding to the periphery region (B) before the third insulation layer 11 between the lower electrodes 23 is removed by wet etching, and it is not possible to dry the wafer by using IPA (IsoPropyl Alcohol). The reason for this is that, in case that the IPA is used in the presence of the photoresist film, the photoresist film will melt.

Therefore, in the conventional art, wet etching is performed in single wafer type equipment using a spin dry method or in bath type equipment in which the wafer is rotated in the state of box for drying.

In the case of the single wafer type equipment using the spin dry method, in order to etch the oxide film, the etching time per a sheet of wafer is lengthened in proportion to the thickness of the oxide film, causing degradation of throughput.

Meanwhile, in the case of the path type equipment for drying the wafer in the state of box, since the rotation radius is lengthened, its centrifugal force becomes too strong, so that there is a high possibility that the lower electrode is released.

SUMMARY OF THE INVENTION

Therefore, an object of the present invention is to provide a method for forming a capacitor of a semiconductor device which is capable of solving problems caused when a lower electrode is separated by etching back.

Another object of the present invention is to provide a method for forming a capacitor of a semiconductor device which is capable of solving problems associated with Chemical Mechanical Polishing (CMP) by removing a slurry foreign material produced when a lower electrode is separated by the CMP.

Still another object of the present invention is to provide a method for forming a capacitor of a semiconductor device which is capable of preventing a periphery region from lowering more than a cell region without using a photoresist film, to thereby reduce process steps and allow use of a bath type wet station of IPA (IsoPropyl Alcohol) vapor drier.

These and other objects are achieved by providing a method for forming a capacitor of a semiconductor device comprising the steps of: forming a first insulation layer on the upper surface of a semiconductor substrate; forming a second insulation layer on the upper surface of the first insulation layer; forming a third insulation layer on the upper surface of the second insulation layer; sequentially etching the third insulation layer and the second insulation layer to form at least one hole over a first region of the semiconductor substrate; forming a conductive layer over the semiconductor substrate; performing Chemical Mechanical Polishing (CMP) until an upper surface of the third insulation layer is exposed; and removing portions of the third insulation layer and slurry material from the first region.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A through 2H show the process steps of a method for forming a capacitor in accordance with the present invention.

Figure 1A:
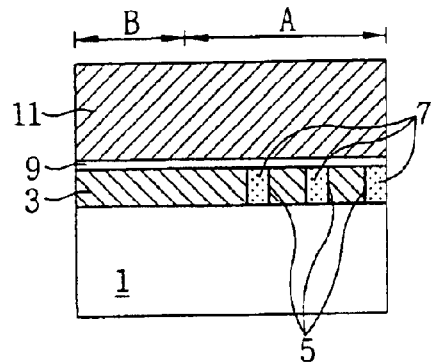
FIGS. 1A through 1G show the process steps of a method for forming a capacitor in accordance with a conventional art.
Figure 1B:
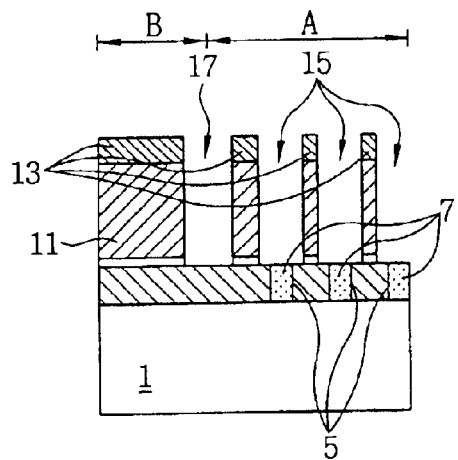
Figure 1C:
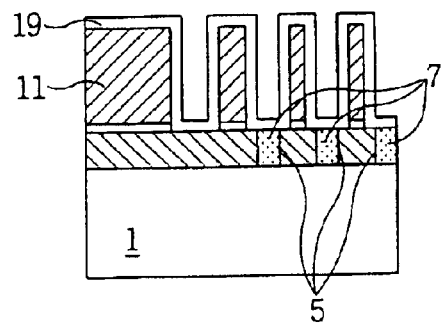
Figure 1D:
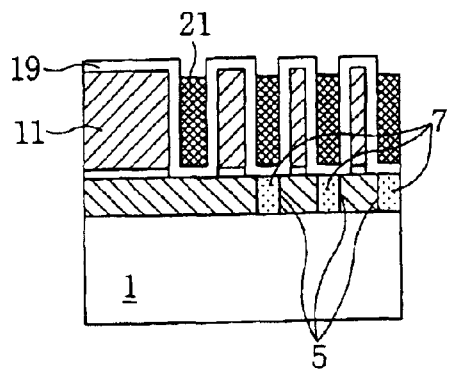
Figure 1E:
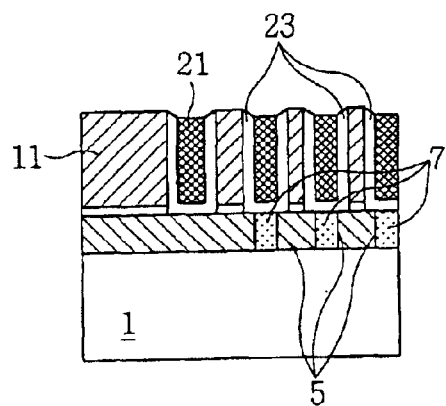
Figure 1F:
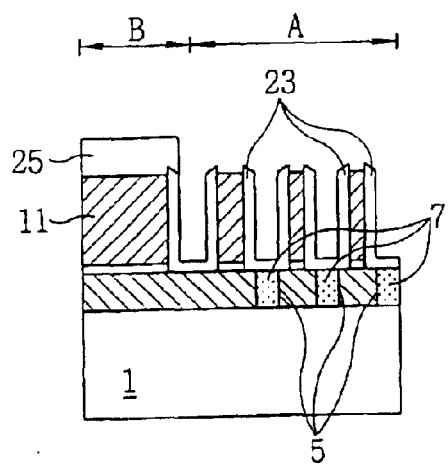
Figure 1G:
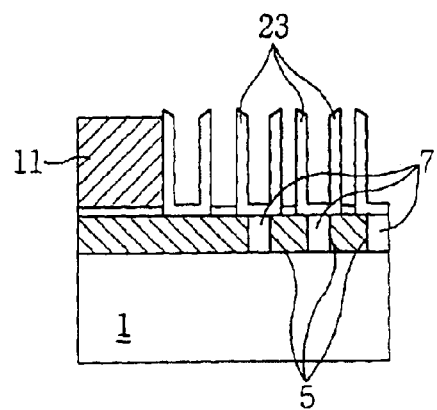
Figure 2A:
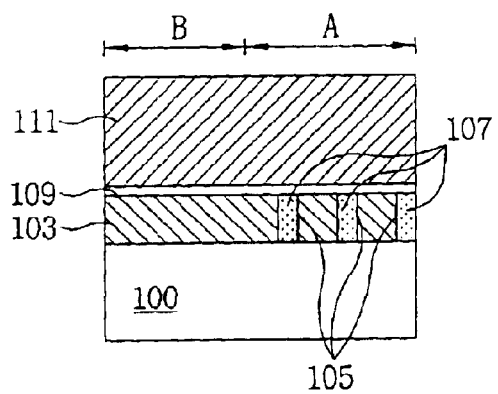
FIGS. 2A through 2H show the process steps of a method for forming a capacitor in accordance with the present invention.

First, as shown in FIG. 2A, a semiconductor substrate 100 having a MOSFET is prepared. The semiconductor substrate 100 is divided into a cell region (A) and a periphery region (B).

A first insulation layer 103, typically made of oxide such as silicon oxide, is formed on the upper surface of the semiconductor substrate 100.

Holes 105 are formed at portions corresponding to the cell region (A) of the first insulation layer 103, and plugs 107 made of a conductive material are formed in the holes 105.

Subsequently, a second insulation layer 109 and a third insulation layer 111 are sequentially formed on the upper surface of the first insulation layer 103 and the plugs 107.

The second insulation layer 109 serves to prevent the first insulation layer 103 from being etched during a subsequent etching process.

The second insulation layer 109 and the third insulation layer 111 are made of materials each having different etching characteristic, and in a preferred embodiment of the present invention, the second insulation layer 109 is made of a nitride such as a silicon nitride and the third insulation layer 111 is made of an oxide such a silicon oxide.

Figure 2B:
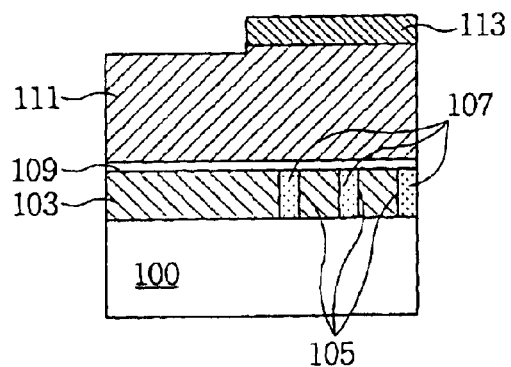

Next, as shown in FIG. 2B, a photoresist film pattern 113 is formed on the upper surface of the third insulation layer 111 corresponding to the cell region (A), and the portion corresponding to the periphery region (B) of the third insulation layer 111 is etched a bit.

In this respect, as will be shown below, the thickness of the third insulation layer 111 after etching has a relation with the thickness of a polycrystalline silicon layer 119 that serves to prevent the periphery region (B) of the third insulation layer from being etched during a subsequent wet etching process. In a preferred embodiment of the present invention, the third insulation layer 111 corresponding to the periphery region (B) is etched to a depth of 100Å~200Å.

Figure 2C:
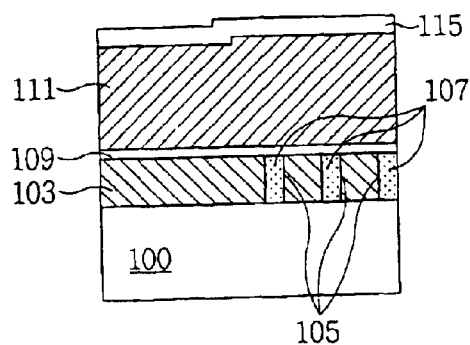

Next, as shown in FIG. 2C, the photoresist pattern 113 is removed, and a hard-masking thin film 115 is formed on the upper surface of the third insulation layer 111. In a preferred embodiment of the present invention, the hard-masking thin film 115 is formed of polycrystalline silicon.

As shown below, he hard-masking thin film 115 serves as a mask together with a photoresist film pattern 117 when holes 121 are formed in a following process. And, an appropriate thickness of the hard-masking thin film 115 remains through a subsequent CMP process, and serves to prevent the third insulation layer 111 over to the periphery region (B) from etching during the wet etching step. Thus, it is important to form the hard-masking thin film 115 with a proper thickness.

Figure 2D:
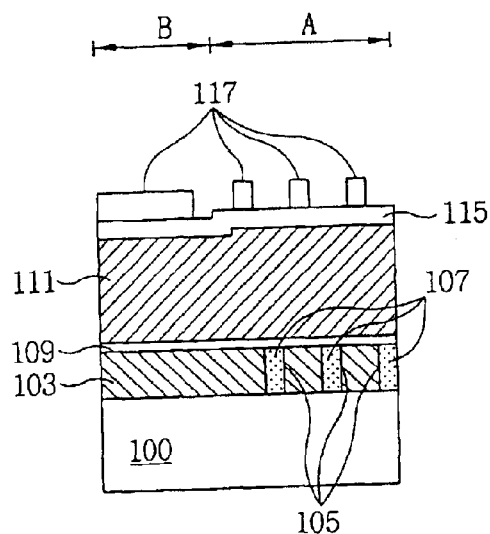

Next, as shown in FIG. 2D, a photoresist film pattern 117 is formed on the upper surface of the hard-masking thin film 115. At this time, the upper surface of the hard-masking thin film 115, on which a hole 121 and a line 123 are to be formed in a follow-up process, is exposed through the photoresist pattern 117. The line 123 follows the boundary between the cell region (A) and the periphery region (B).

Figure 2E:
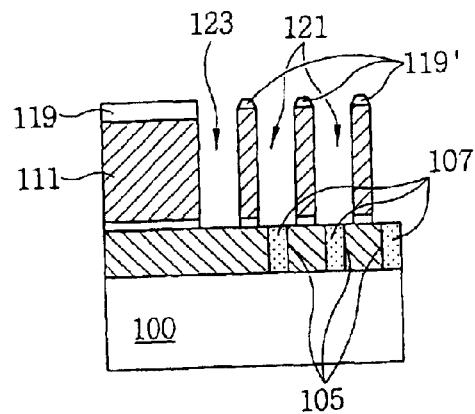

And then, as shown in FIG. 2E, the hard-masking thin film 115 is patterned by using the photoresist film pattern 117 as a mask to form hard masks 119 and 119', and predetermined portions of the third insulation layer 111 and of the second insulation layer 109 are sequentially etched by using the photoresist film pattern 117 and the hard masks 119 and 119' as a mask. This forms the hole 121 and the line 123.

The hole 121 exposes the plug 107, on which a lower electrode is to be formed in a subsequent process. The line 123 serves to differentiate the cell region (A) and the periphery region (B) of the semiconductor device, and to prevent wet-etching solution from flowing to the periphery region during a follow-up wet etching process.

During the etching process for forming the hole 121 and the line 123, the photoresist pattern 117 of cell region (A) and periphery region (B) is removed, and the hard-masking polycrystalline silicon of the cell region (A) having numerous hole patterns is etched more than the periphery region (B). As a result, the hard mask 119 on the periphery region (B) becomes thicker than the hard mask 119' of the cell region (A). In general, small patterns such as the numerous hole pattern of the cell region (A) etch more quickly than a larger pattern such as at the periphery region (B); hence, the resulting thickness difference between hard mask 119 and hard mask 119'.

Figure 2F:
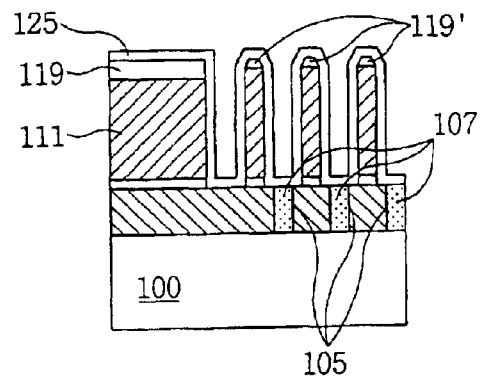

Next, as shown in FIG. 2F, a conductive film 125 for a lower electrode is formed on the whole surface of the structure shown in the FIG. 2E. In a preferred embodiment of the present invention, the conductive film 125 is made of polycrystalline silicon.

Figure 2G:
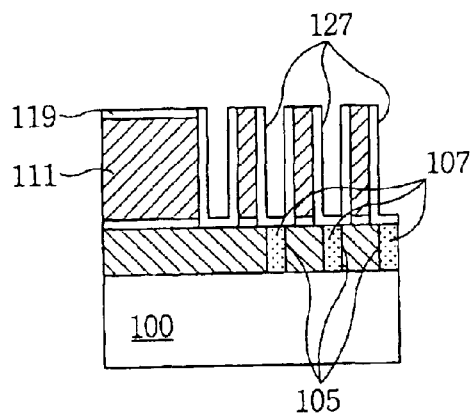

And then, as shown in FIG. 2G, the conductive film 125 for a lower electrode is separated by a CMP process, and a lower electrode 127 is formed in each hole 121.

The lower electrode 127 is connected with the plug 107. In this respect, in case of the CMP, since the selection ratio between the polycrystalline silicon and the oxide film is very high, once the oxide film, forming the third insulation layer 111, is exposed while the polycrystalline silicon of the cell region (A) is being polished, polishing is stopped.

Accordingly, the hard mask 119' of the cell region (A) is completely removed while the hard mask 119 of the periphery region (B) remains with a reduced thickness.

Meanwhile, after the CMP process, a large quantity of slurry foreign material (not shown) remains at the inner side of the lower electrode 127.

Figure 2H:
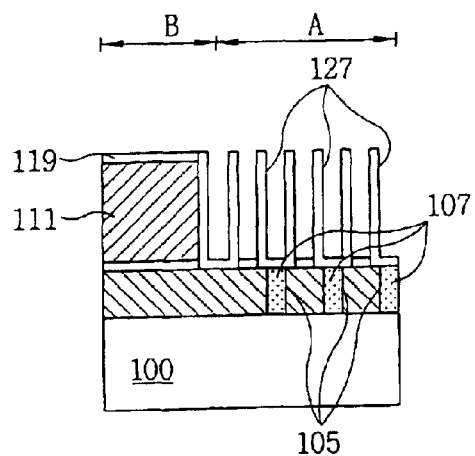

Lastly, as shown in FIG. 2H, the third insulation layer 111 of the cell region (A) is etched and removed, thereby completing a lower electrode of a capacitor. In a preferred embodiment of the present invention, wet etching is performed.

At this time, the hard mask 119, made of the polycrystalline silicon, formed on the upper surface of the third insulation layer 111 of the periphery region (B) prevents the third insulation layer 111 from being etched.

The slurry foreign material (not shown) remaining at the inner side of the lower electrode 127 is also removed after the CMP process during the wet etching. Accordingly, the finally obtained lower electrode 127 has almost the same height as the thickness of the originally formed third insulation layer 111 shown in FIG. 2A.

As so far described, the method for forming a capacitor of a semiconductor device in accordance with the present invention has the following effects.

First, according to the method for forming a capacitor of a semiconductor device of the present invention, even though a CMP process is employed to form the lower electrode, there is no decrease in the height of the lower electrode, and the problem in the conventional art that the upper portion of the lower electrode becomes sharp during an etch back process does not occur. Thus, a favorable capacitance is obtained.

Secondly, according to the method, a photoresist film pattern is not used as a mask in etching the third insulation layer between the lower electrodes so that a bath-type wet station can be used.

Thirdly, according to the method, since the slurry foreign material generated when the lower electrode is separated through the CMP process can be removed, the CMP process can be performed while preventing deficiencies due to the presence of the slurry foreign material.

Fourthly, according to the method, during the process of separating the lower electrode, the conventional process step of filling the holes containing the conductive film with an oxide film, such as the SOG (Spin On Glass) or the USG (Undoped Silica Glass) having a good gap fill characteristic is not necessary, and the whole process is simplified.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for forming a capacitor of a semiconductor device comprising the steps of:

forming a first insulation layer on the upper surface of a semiconductor substrate;

forming a second insulation layer on the upper surface of the first insulation layer;

forming a third insulation layer on the upper surface of the second insulation layer;

etching a predetermined depth of the third insulation layer over a first region of the semiconductor substrate so that a thickness of the third insulation layer over the first region is thinner than a thickness of the third insulation layer over a second region of the semiconductor substrate;

sequentially etching the third insulation layer and the second insulation layer to form at least one hole over the second region of the semiconductor substrate;

forming a conductive layer over the semiconductor substrate;

performing Chemical Mechanical Polishing (CMP) until an upper surface of the third insulation layer is exposed; and removing portions of the third insulation layer from the second region.

2. The method according to claim 1, wherein the second and the third insulation layers have different etching characteristic with respect to each other.

3. The method according to claim 2, wherein the second insulation layer is made of a nitride.

4. The method according to claim 2, wherein the third insulation layer is made of an oxide.

5. The method according to claim 1, wherein the first insulation layer is made of an oxide.

6. The method according to claim 1, wherein the depth is 100Å~2000Å.

7. The method according to claim 1, after the etching a predetermined depth step and prior to the sequentially etching step, further comprising a step of:

forming a hard-masking thin film on the upper surface of the third insulation layer; and patterning the hard-masking thin film to form a hard mask.

8. The method according to claim 7, wherein the hard-masking thin film is made of polycrystalline silicon.

9. The method according to claim 7, wherein the hard mask formed on the upper surface of the third insulation layer over the first region remains after the performing CMP step.

10. The method according to claim 1, wherein the sequentially etching step further forms a line along a boundary between the first region and a second region of the semiconductor substrate by removing portions of the third insulation layer and of the second insulation layer.

11. The method according to claim 1, wherein the conductive layer is made of polycrystalline silicon.

12. The method according to claim 1, wherein the removing step is performed using a wet station.

13. The method according to claim 12, wherein the wet station is a bath type.

14. The method according to claim 12, wherein the wet station employs an IPA vapor drier.

15. The method of claim 1, prior to the sequentially etching step, further comprising:

forming a hard mask film on the third insulation film;

forming a photoresist pattern on the hard mask film; and wherein the sequentially etching step etches the hard mask film using the photoresist pattern as a mask and etches the third and second insulation layers using the etched hard mask film and the photoresist pattern.

16. The method of claim 1, wherein the performing CMP step forms non-sharp upper edges of the conductive layer.

17. The method of claim 1, wherein the removing step further removes slurry material from the first region.

18. A method for forming a capacitor of a semiconductor device comprising the steps of:

forming a first insulation layer on the upper surface of a semiconductor substrate;

forming a second insulation layer on the upper surface of the first insulation layer;

forming a third insulation layer on the upper surface of the second insulation layer;

etching the third insulation layer over a peripheral portion of the semiconductor substrate;

forming a hard mask film over the third insulating layer;

forming a photoresist pattern on the hard mask film;

sequentially etching the hard mark film, the third insulation layer and the second insulation layer to form at least one hole over a first region of the semiconductor substrate;

forming a conductive layer over the semiconductor substrate;

performing Chemical Mechanical Polishing (CMP) until an upper surface of the third insulation layer is exposed; and removing portions of the third insulation layer from the first region.

* * * * *